(12) United States Patent
Kim et al.

(10) Patent No.: US 11,348,938 B2
(45) Date of Patent: May 31, 2022

(54) METHODS OF MANUFACTURING A VERTICAL MEMORY DEVICE

(71) Applicant: SAMSUNG ELECTRONICS CO., LTD., Suwon-si (KR)

(72) Inventors: Il-Woo Kim, Hwaseong-si (KR); Sang-Gi An, Hwaseong-si (KR); Hyun-Gon Pyo, Seoul (KR); Ik-Soo Kim, Yongin-si (KR); Hee-Sook Park, Hwaseong-si (KR); Ji-Woon Im, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 249 days.

(21) Appl. No.: 16/446,028

(22) Filed: Jun. 19, 2019

(65) Prior Publication Data
US 2020/0168628 A1    May 28, 2020

(30) Foreign Application Priority Data
Nov. 27, 2018  (KR) .................. 10-2018-0148338

(51) Int. Cl.
*H01L 21/336*      (2006.01)
*H01L 27/11582*    (2017.01)
*H01L 21/311*      (2006.01)
*H01L 27/11565*    (2017.01)

(52) U.S. Cl.
CPC ... *H01L 27/11582* (2013.01); *H01L 21/31111* (2013.01); *H01L 27/11565* (2013.01)

(58) Field of Classification Search
CPC ......... H01L 21/31111; H01L 27/11565; H01L 27/11582; H01L 27/11563; H01L 27/1157; H01L 27/11556; H01L 21/02164; H01L 21/32055; H01L 23/315; H01L 27/11524; H01L 29/66825; H01L 29/66833
USPC ........................................ 438/268
See application file for complete search history.

(56) References Cited

U.S. PATENT DOCUMENTS

| | | |
|---|---|---|
| 9,589,960 B1 | 3/2017 | Min |
| 9,831,266 B2 | 11/2017 | Kai et al. |
| 9,842,855 B2 | 12/2017 | Lee |
| 9,859,296 B2 | 1/2018 | Park et al. |
| 9,991,271 B2 | 6/2018 | Kang et al. |
| 2015/0179657 A1 | 6/2015 | Inumiya |
| 2017/0365612 A1 | 12/2017 | Yun et al. |

(Continued)

FOREIGN PATENT DOCUMENTS

KR    10-2014-0020145 A    2/2014

*Primary Examiner* — Marcos D. Pizarro
*Assistant Examiner* — Dilinh P Nguyen
(74) *Attorney, Agent, or Firm* — Myers Bigel, P.A.

(57) ABSTRACT

In a method of manufacturing a vertical memory device, a first sacrificial layer including a nitride is formed on a substrate. A mold including an insulation layer and a second sacrificial layer alternately and repeatedly stacked on the first sacrificial layer is formed. The insulation layer and the second sacrificial layer include a first oxide and a second oxide, respectively. A channel is formed through the mold and the first sacrificial layer. An opening is formed through the mold and the first sacrificial layer to expose an upper surface of the substrate. The first sacrificial layer is removed through the opening to form a first gap. A channel connecting pattern is formed to fill the first gap. The second sacrificial layer is replaced with a gate electrode.

14 Claims, 20 Drawing Sheets

(56) References Cited

U.S. PATENT DOCUMENTS

2018/0090512 A1 3/2018 Kim et al.
2018/0151672 A1 5/2018 Choi et al.

METHODS OF MANUFACTURING A VERTICAL MEMORY DEVICE

CROSS-REFERENCE TO RELATED APPLICATIONS

This application claims priority under 35 USC § 119 to Korean Patent Application No. 10-2018-0148338, filed on Nov. 27, 2018 in the Korean Intellectual Property Office (KIPO), the contents of which are herein incorporated by reference in their entirety.

BACKGROUND

The inventive concepts relate to a method of manufacturing a vertical memory device.

In order to connect channels to a substrate in a VNAND flash memory device, channel holes may be formed through a mold including insulation layers and sacrificial layers alternately stacked on the substrate to expose upper surfaces of the substrate. A selective epitaxial growth (SEG) process may be performed using the exposed upper surfaces of the substrate as a seed to form semiconductor patterns, and channels may be formed on the semiconductor patterns. However, the semiconductor patterns may have distributions of characteristics, e.g., height distributions, and particularly, in a COP structure in which circuit patterns may be formed under a memory cell array, the SEG process may be performed using a polysilicon layer as a seed on the circuit patterns, so that forming the semiconductor patterns uniformly may not be easy.

SUMMARY

Example embodiments provide a method of manufacturing a vertical memory device having improved characteristics.

According to some embodiments of the inventive concept, there is provided a method of manufacturing a vertical memory device. In the method, a first sacrificial layer including a nitride may be formed on a substrate. A mold including an insulation layer and a second sacrificial layer alternately and repeatedly stacked on the first sacrificial layer may be formed. The insulation layer and the second sacrificial layer may include a first oxide and a second oxide, respectively. A channel may be formed through the mold and the first sacrificial layer. An opening may be formed through the mold and the first sacrificial layer to expose an upper surface of the substrate. The first sacrificial layer may be removed through the opening to form a first gap. A channel connecting pattern may be formed to fill the first gap. The second sacrificial layer may be replaced with a gate electrode.

According to some embodiments of the inventive concept, there is provided a method of manufacturing a vertical memory device. In the method, a mold including an insulation layer and a first sacrificial layer alternately and repeatedly stacked may be formed on a substrate. The insulation layer may include silicon oxide, and the first sacrificial layer may include germanium oxide or silicon oxide doped with germanium. A channel may be formed through the mold. An opening may be formed through the mold to expose an upper surface of the substrate. The first sacrificial layer may be removed through the opening to form a first gap. A gate electrode may be formed in the first gap.

According to some embodiments of the inventive concept, there is provided a method of manufacturing a vertical memory device. In the method, a first sacrificial layer including a nitride may be formed on a substrate. A mold including an insulation layer and a second sacrificial layer alternately and repeatedly stacked may be formed on the first sacrificial layer. The insulation layer may include silicon oxide, and the second sacrificial layer may include germanium oxide or silicon oxide doped with germanium. A channel may be formed through the mold and the first sacrificial layer. An opening may be formed through the mold and the first sacrificial layer to expose an upper surface of the substrate. The first sacrificial layer may be removed through the opening to form a gap. A channel connecting pattern may be formed to fill the gap. The second sacrificial layer may be replaced with a gate electrode.

In a method of manufacturing a vertical memory device, when the first sacrificial layer for forming the channel connecting pattern is removed through the opening extending through the mold including the insulation layer and the second sacrificial layer, the first sacrificial layer may include a material having a high etching selectivity with respect to the insulation layer and the second sacrificial layer of the mold, and thus no etch stop pattern covering the sidewall of the opening may be formed. Accordingly, the channel connecting pattern may be formed by a reduced number of processes.

Particularly, when the gate electrode is formed by removing the second sacrificial layer, the second sacrificial layer may not include a nitride, and thus a C—N residue may not be generated during the removal of the second sacrificial layer, and the deterioration of the characteristics of the channel may be prevented.

DETAILED DESCRIPTION

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below. As used herein, the term "and/or" includes any and all combinations of one or more of the associated listed items. Expressions such as "at least one of," when preceding a list of elements, modify the entire list of elements and do not modify the individual elements of the list.

The above and other aspects and features of the vertical memory devices and the methods of manufacturing the same in accordance with example embodiments will become readily understood from detail descriptions that follow, with reference to the accompanying drawings. Hereinafter, a direction substantially perpendicular to an upper surface of a substrate may be defined as a first direction, and two directions substantially parallel to the upper surface of the substrate and crossing each other may be defined as second and third directions, respectively. In example embodiments, the second and third directions may be substantially perpendicular to each other. It will be understood that, although the terms first, second, third, etc. may be used herein to describe various elements, and elements should not be limited by these terms; rather, these terms are only used to distinguish one element from another element. Thus, a first element discussed could be termed a second element without departing from the scope of the present inventive concepts.

FIGS. 1 to 16 are plan views and cross-sectional views illustrating a method of manufacturing a vertical memory device in accordance with example embodiments. Particularly, FIGS. 1, 4, 7 and 15 are the plan views, and FIGS. 2-3, 5-6, 8-14 and 16 are cross-sectional views taken along lines A-A', respectively, of corresponding plan views.

Figure 1:
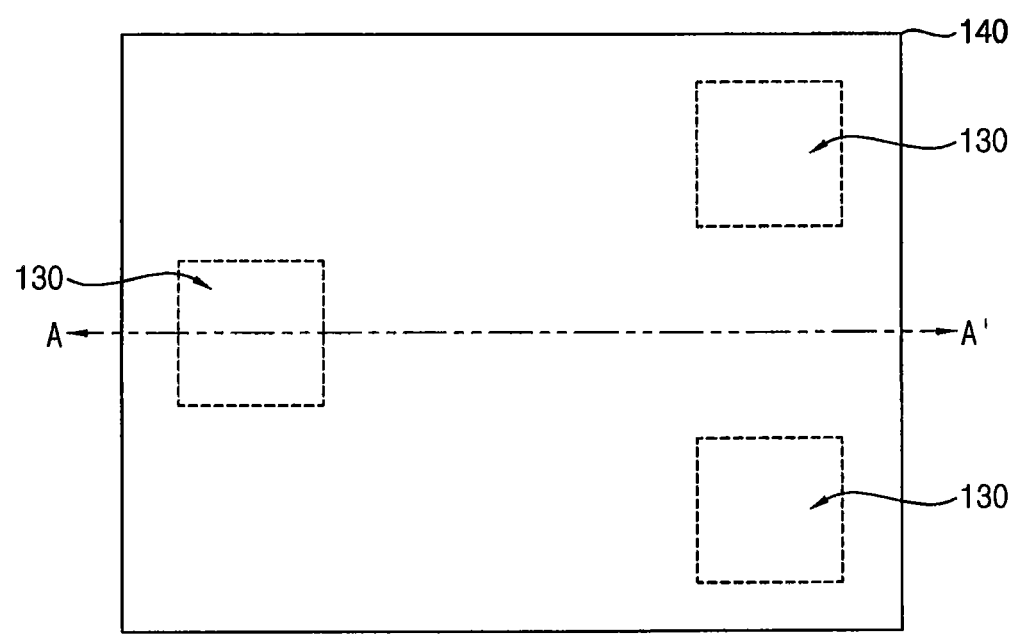
FIGS. 1 to 16 are plan views and cross-sectional views illustrating a method of manufacturing a vertical memory device in accordance with example embodiments.
Figure 1:
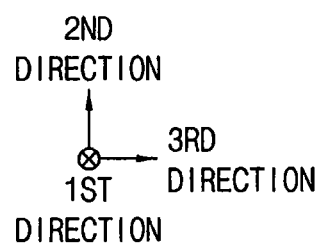
Figure 2:
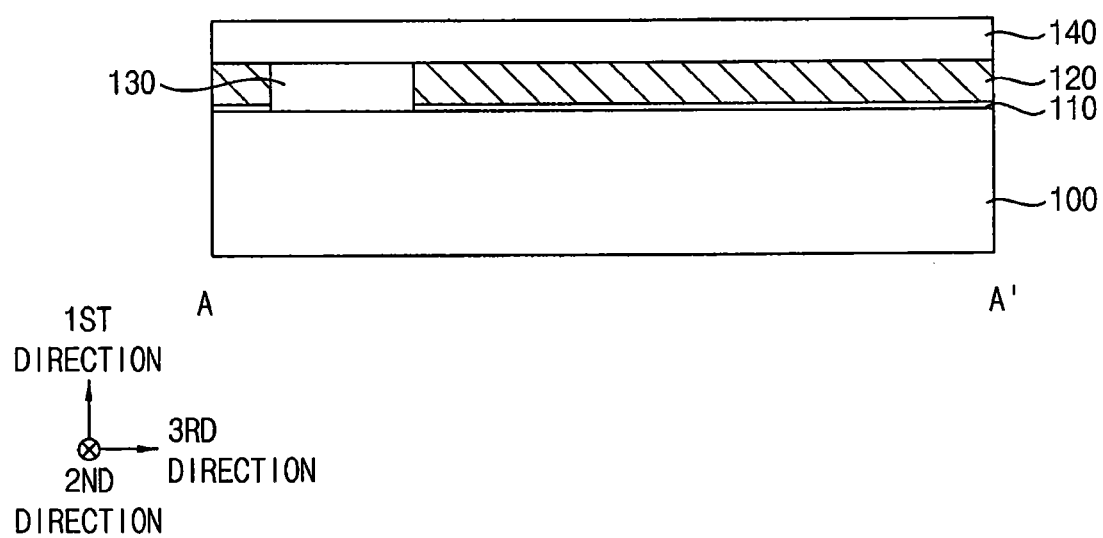

Referring to FIGS. 1 and 2, a pad layer 110 and a first sacrificial layer 120 may be sequentially stacked on a substrate 100, the pad layer 110 and the first sacrificial layer 120 may be partially removed to form a support pattern 130 on the substrate 100, and a support layer 140 may be formed on the first sacrificial layer 120 and the support pattern 130.

The substrate 100 may include silicon, germanium, silicon-germanium or a Group III-V compound such as GaP, GaAs, GaSb, etc. In some embodiments, the substrate 100 may be a silicon-on-insulator (SOI) substrate or a germanium-on-insulator (GOI) substrate.

The pad layer 110 may include an oxide, e.g., silicon oxide, and the first sacrificial layer 120 may include a nitride, e.g., silicon nitride.

In example embodiments, the support pattern 130 and the support layer 140 may include a material having an etching selectivity with respect to the first sacrificial layer 120, e.g., doped or undoped polysilicon. However, the support pattern 130 and the support layer 140 may be formed by forming amorphous silicon and annealing the amorphous silicon so as to include polysilicon. In some embodiments, the support pattern 130 and the support layer 140 may be formed such that the amorphous silicon may be crystallized through heat generated by deposition processes of other layers.

The support pattern 130 may be formed by partially removing the pad layer 110 and the first sacrificial layer 120 to form a first opening, and filling the first opening. Thus, an upper surface of the support pattern 130 may have a height substantially coplanar with an upper surface of a structure including the pad layer 110 and the first sacrificial layer 120. A sidewall of the support pattern 130 may contact sidewalls of the pad layer 110 and the first sacrificial layer 120.

The support pattern 130 may overlap an area at which a second opening 290 may be formed, which will be illustrated with reference to FIGS. 7 and 8. The second opening 290 may extend in the second direction, and a plurality of second openings 290 may be formed in the third direction. Thus, one or a plurality of support patterns 130 may be formed in the second direction, and a plurality of support patterns 130 may be formed in the third direction.

Figure 3:
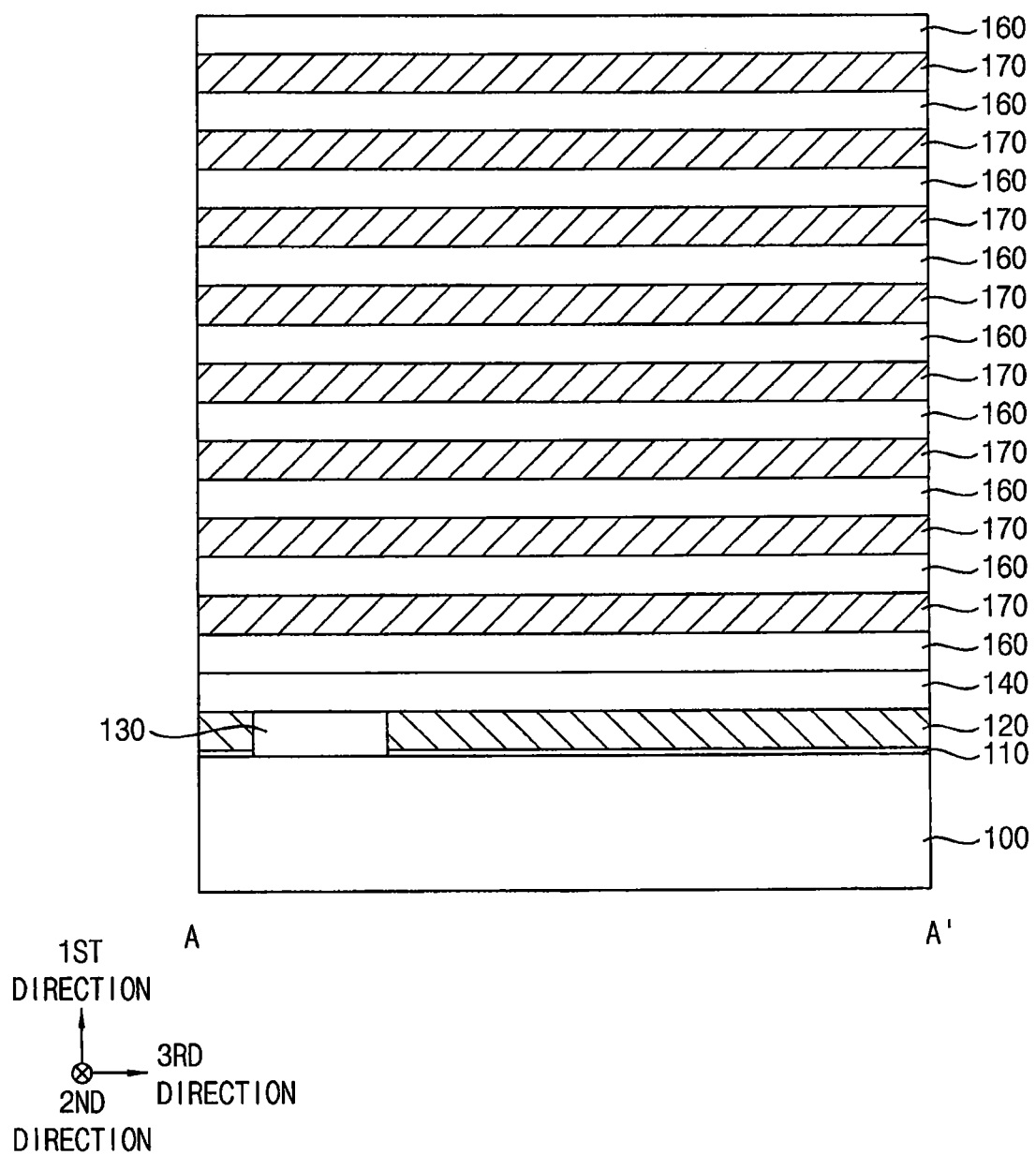

Referring to FIG. 3, an insulation layer 160 and a second sacrificial layer 170 may be alternately and repeatedly formed on the support layer 140 to form a mold.

The insulation layer 160 may include an oxide, e.g., silicon oxide, and the second sacrificial layer 170 may include a material different from those of the insulation layer 160 and the first sacrificial layer 120. In example embodiments, the second sacrificial layer 170 may include a material having etching selectivity with respect to silicon oxide and silicon nitride of the insulation layer 160 and the first sacrificial layer 120, respectively. Thus, the second sacrificial layer 170 may include, e.g., germanium oxide ($GeO_2$) or silicon oxide doped with germanium (Ge-doped $SiO_2$).

Particularly, when the second sacrificial layer 170 includes germanium oxide, a first etching selectivity of the second sacrificial layer 170 with respect to the insulation layer 160 including, e.g., silicon oxide may be greater than a second etching selectivity of the first sacrificial layer 120 including, e.g., silicon nitride with respect to the insulation layer 160 including silicon oxide.

The insulation layer 160 and the second sacrificial layer 170 may be formed by, e.g., a chemical vapor deposition (CVD) process, a plasma enhanced chemical vapor deposition (PECVD) process, an atomic layer deposition (ALD) process, etc.

Figure 4:
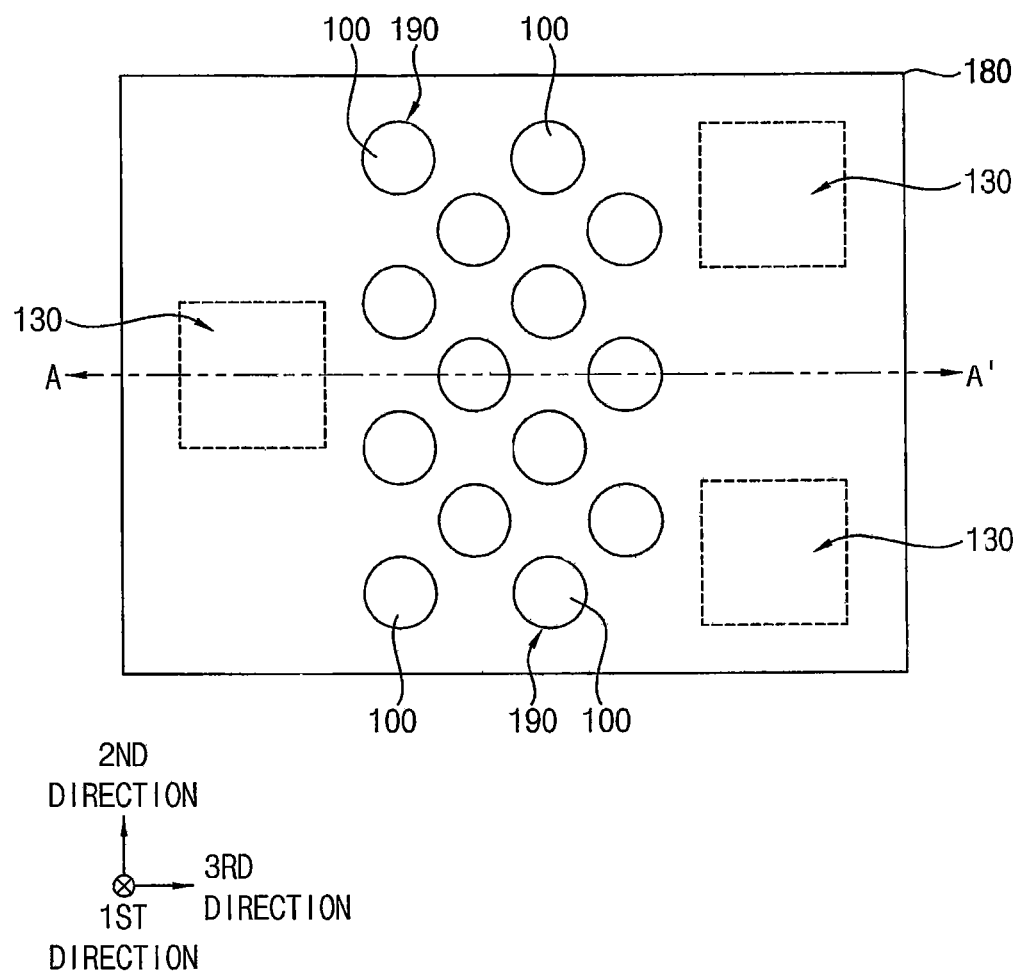
Figure 5:
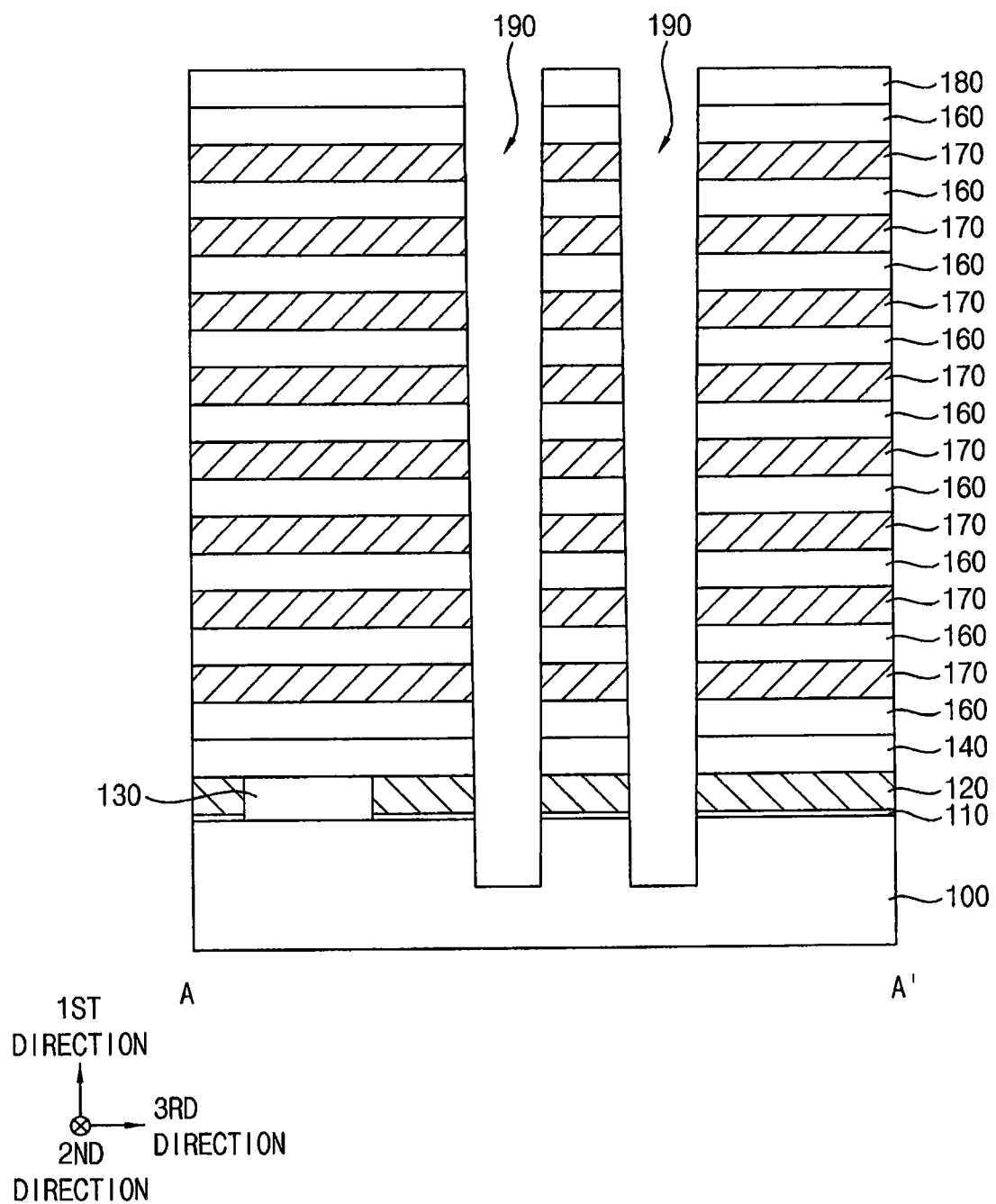

Referring to FIGS. 4 and 5, a first insulating interlayer 180 may be formed on an uppermost one of the insulation layers 160, and a channel hole 190 may be formed through the first insulating interlayer 180, the mold, the support layer 140, the first sacrificial layer and the pad layer 110 by a dry etching process.

The first insulating interlayer 180 may include an oxide, e.g., silicon oxide.

In example embodiments, the dry etching process may be performed until an upper surface of the substrate 100 may be exposed, and an upper portion of the substrate 100 may be further removed in the dry etching process.

In example embodiments, a plurality of channel holes 190 may be formed in each of the second and third directions, and thus a channel hole array may be defined. The channel holes may be arranged in rows and columns offset from one another in the second direction, as illustrated in FIG. 4. In some embodiments, the channel holes may be aligned in both the second direction and the third direction.

Figure 6:
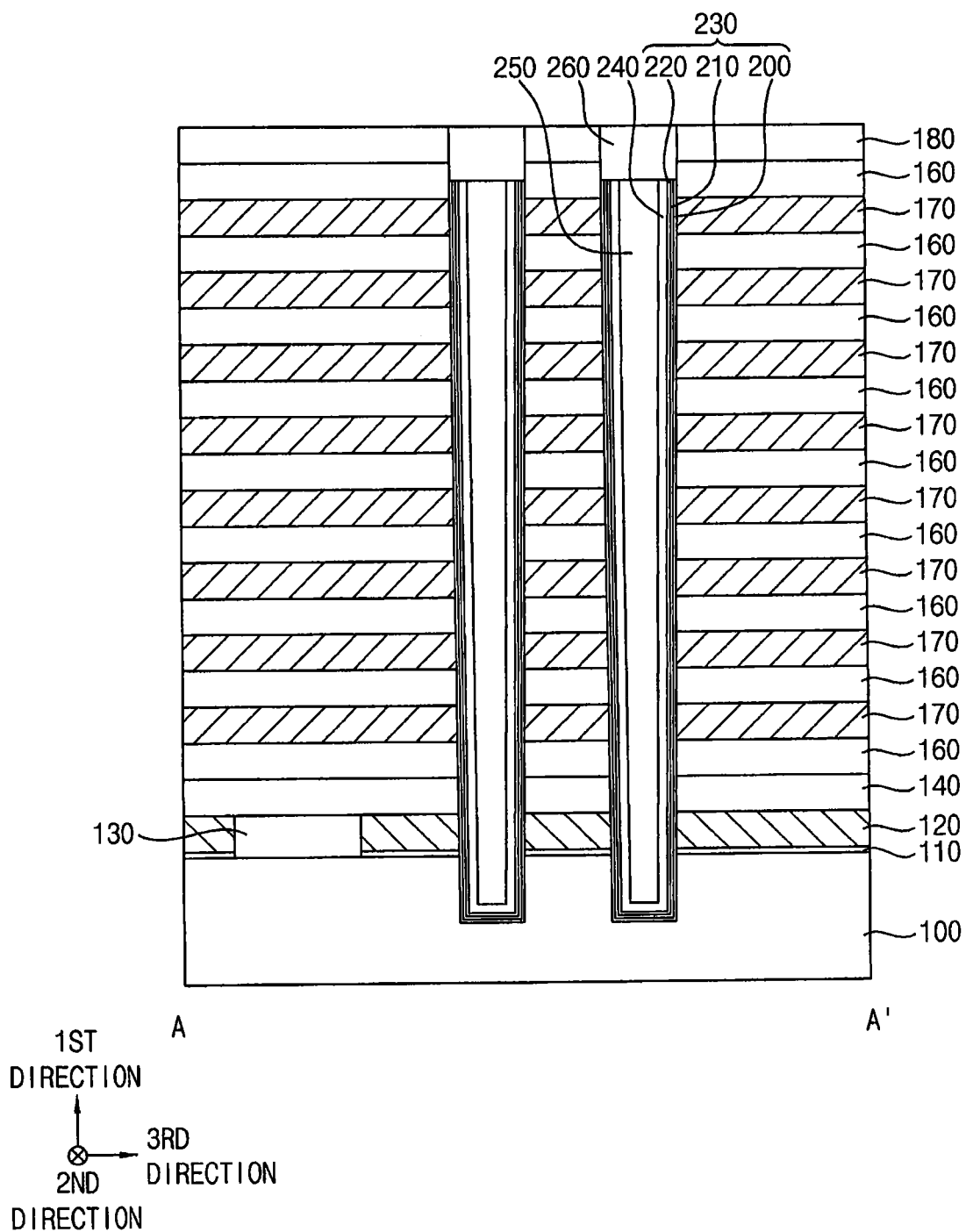

Referring to FIG. 6, a charge storage structure 230, a channel 240, a filling pattern 250 and a capping pattern 260 may be formed in the channel hole 190.

Particularly, a charge storage structure layer and a channel layer may be sequentially formed on a sidewall of the channel hole 190 of FIG. 5, the exposed upper surface of the substrate 100 and an upper surface of the first insulating interlayer 180. A filling layer may be formed on the channel layer to fill a remaining portion of the channel hole 190. The filling layer, the channel layer and the charge storage structure layer may be planarized until the upper surface of the first insulating interlayer 180 may be exposed.

In example embodiments, the planarization process may include a chemical mechanical polishing (CMP) process and/or an etch back process.

By the planarization process, the charge storage structure 230 and the channel 240 sequentially stacked on the sidewall of the channel hole 190 and the upper surface of the substrate 100 may be formed, and the filling pattern 250 may fill an inner space formed by the channel 240.

As the channel hole 190 in which the channel 240 is formed may define the channel hole array, the channel 240 in the channel hole 190 may also define a channel array.

In example embodiments, the charge storage structure 230 may include a first blocking pattern 200, a charge storage pattern 210 and a tunnel insulation pattern 220 sequentially stacked. For example, the first blocking pattern 200, the charge storage pattern 210 and the tunnel insulation pattern 220 may include silicon oxide, silicon nitride and silicon oxide, respectively.

The channel 240 may include, e.g., undoped polysilicon, and the filling pattern 250 may include an oxide, e.g., silicon oxide.

Upper portions of the filling pattern 250, the channel 240 and the charge storage structure 230 may be removed to form a recess, a capping layer may be formed on the first insulating interlayer 180 to fill the recess, and the capping layer may be planarized until the upper surface of the first insulating interlayer 180 may be exposed to form a capping pattern 260.

Figure 7:
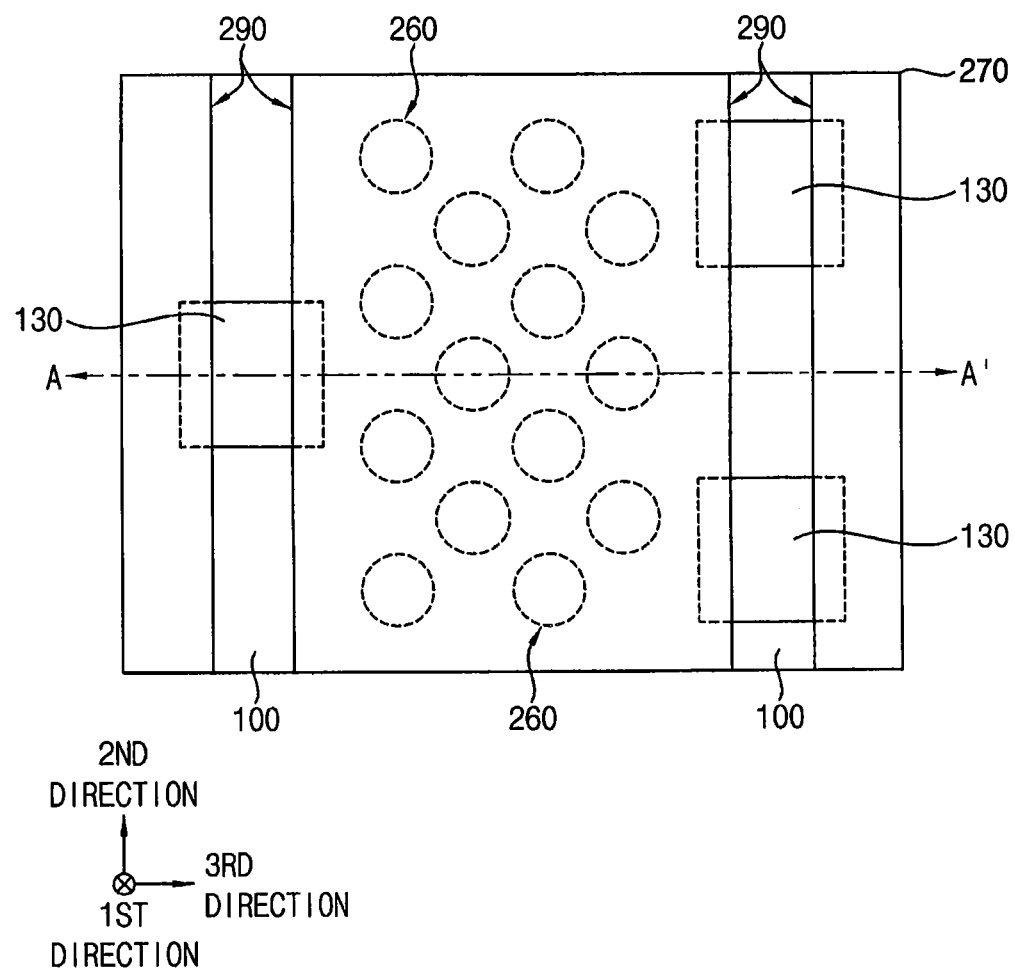
Figure 8:
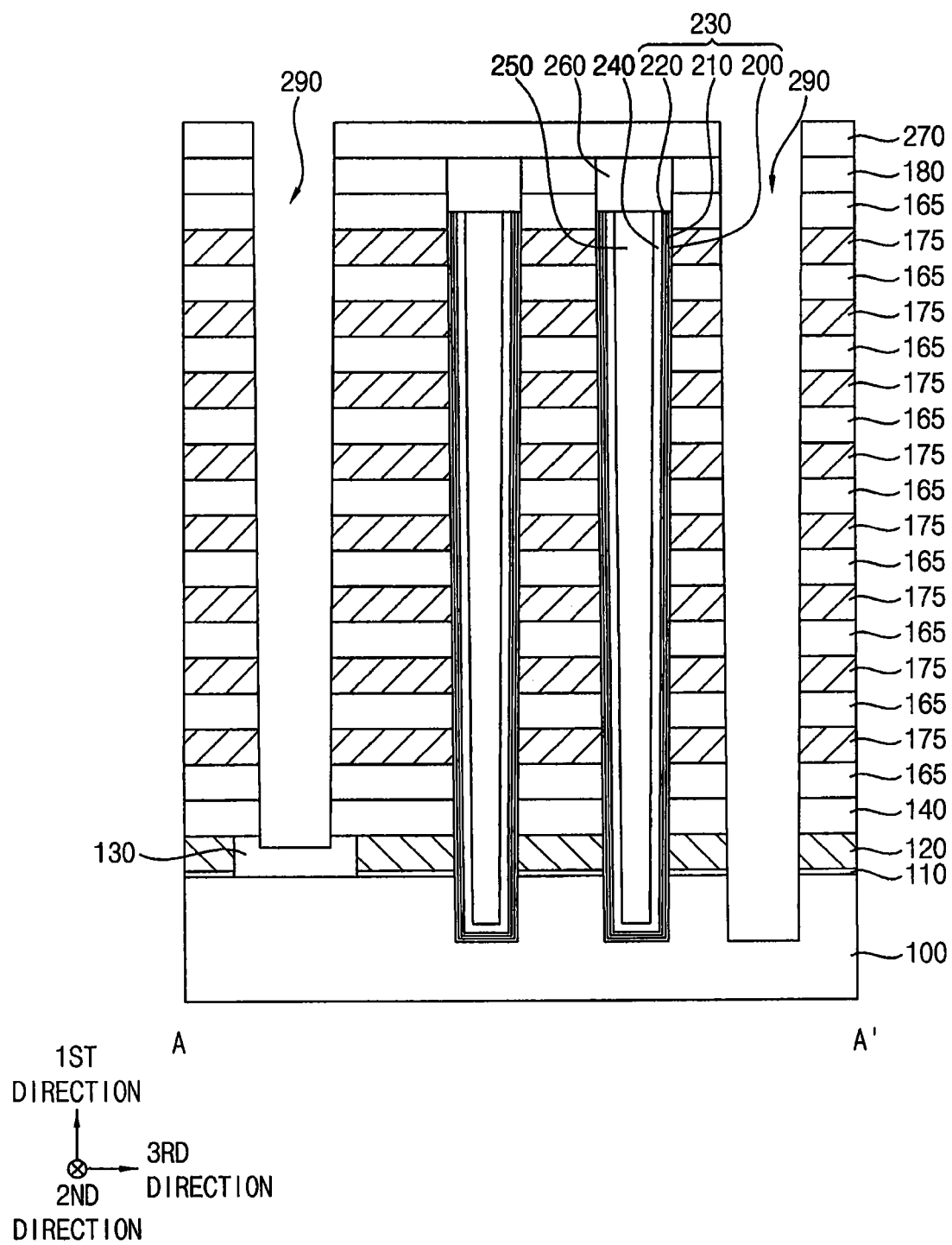

Referring to FIGS. 7 and 8, a second insulating interlayer 270 may be formed on the first insulating interlayer 180 and the capping pattern 260, and a second opening 290 may be formed through the first and second insulating interlayers 180 and 270, the mold, the support layer 140, the first sacrificial layer 120 and the pad layer 110 by a dry etching process.

In example embodiments, the dry etching process may be performed until the upper surface of the substrate 100 may be exposed, and/or an upper surface of the support pattern 130 may be also exposed. Additionally, upper portions of the substrate 100 and the support pattern 130 may be also removed during the dry etching process. As the second opening 290 is formed, the first sacrificial layer 120, and the insulation layer 160 and the second sacrificial layer 170 of the mold may be exposed.

In example embodiments, the second opening 290 may extend in the second direction, and a plurality of second openings 290 may be formed in the third direction. As the second opening 290 is formed, the insulation layer 160 may be transformed into an insulation pattern 165 extending in the second direction, and the second sacrificial layer 170 may be transformed into a second sacrificial pattern 175 extending in the second direction.

Figure 9:
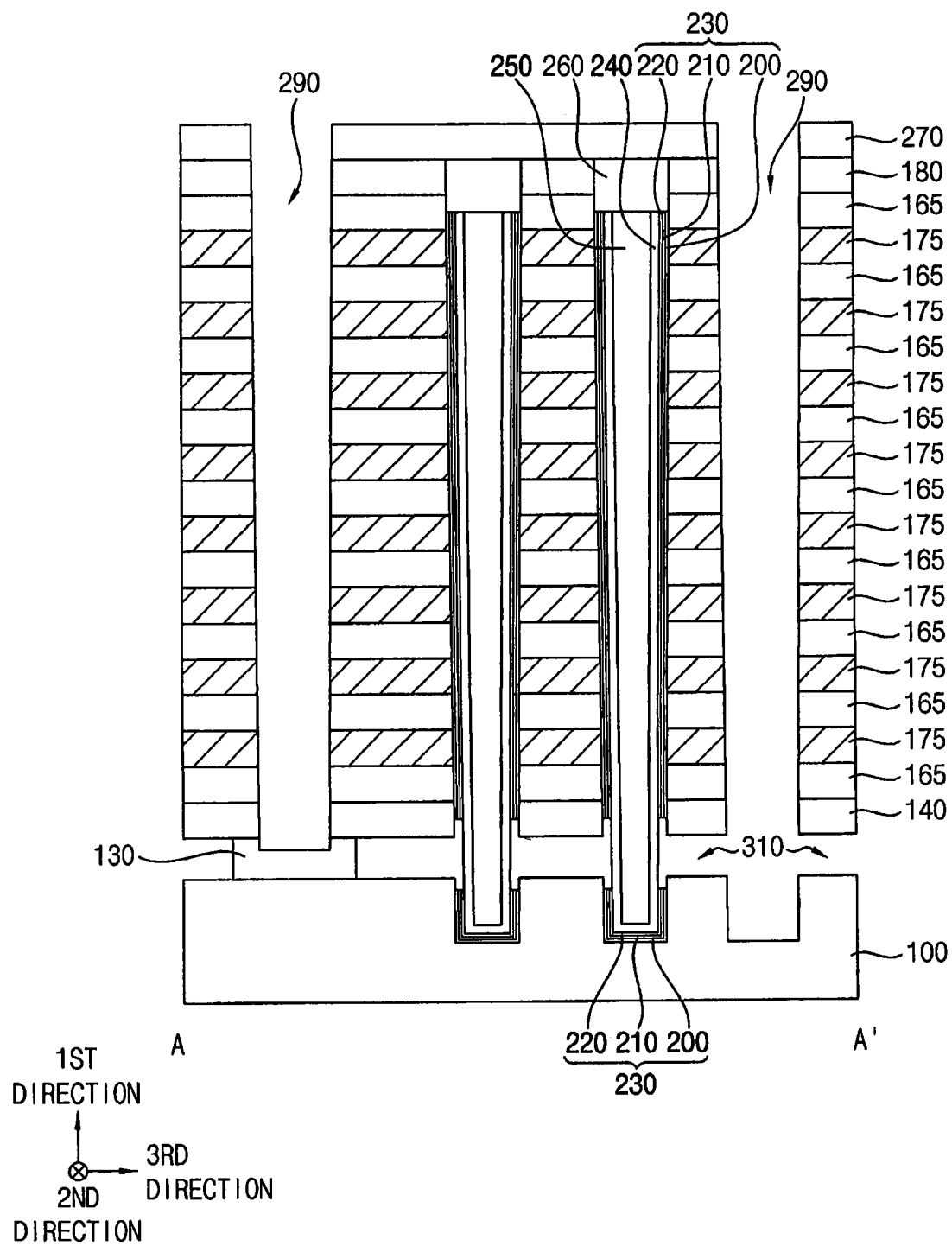

Referring to FIG. 9, the first sacrificial layer 120 exposed by the second opening 290 may be removed to form a first gap 310.

Thus, a sidewall of the support pattern 130 and a portion of a sidewall of the charge storage structure 230 may be exposed by the first gap 310.

In example embodiments, the first sacrificial layer 120 may be removed by a wet etching process using a solution including phosphoric acid or sulfuric acid. During the wet etching process, the insulation pattern 165 and the second sacrificial pattern 175 of the mold may be exposed by the second opening 290. However, each of the insulation pattern 165 including, e.g., silicon oxide and the second sacrificial pattern 175 including, e.g., germanium oxide may have an etching selectivity with respect to the first sacrificial layer 120, and thus may not be damaged by the wet etching process. Accordingly, an etch stop pattern for covering the sidewall of the second opening 290 may not be needed to be formed to protect the mold before the wet etching process, and thus the processes may be simple.

In example embodiments, when the first gap 310 is formed by the wet etching process, the mold may not collapse by the support pattern 130 and the support layer 140.

The portion of the charge storage structure 230 exposed by the first gap 310 may be removed to expose an outer sidewall of the channel 240 covered by the charge storage structure 230. The pad layer 110 on the substrate 100 may be also removed.

The exposed portion of the charge storage structure 230 may be removed by, e.g., a wet etching process. The charge storage structure 230 and the pad layer 110 may have a thin thickness, and thus, when the wet etching process is performed, other layer structures, e.g., the insulation pattern 165 of the mold may not be damaged.

The wet etching process may have isotropic characteristic, and thus not only the portion of the charge storage structure 230 exposed by the first gap 310 but also a portion of the charge storage structure 230 contacting a sidewall of the support layer 140 facing the outer sidewall of the channel 240 may be also partially removed. However, a portion of the charge storage structure 230 contacting an upper sidewall of the support layer 140 and a portion of the charge storage structure 230, which may be adjacent the sidewall of the support layer 140 and contact the channel 240, may remain.

By the wet etching process, a portion of the charge storage structure 230 penetrating through an upper portion of the substrate 100 may be divided from a portion thereof penetrating through the mold.

Figure 10:
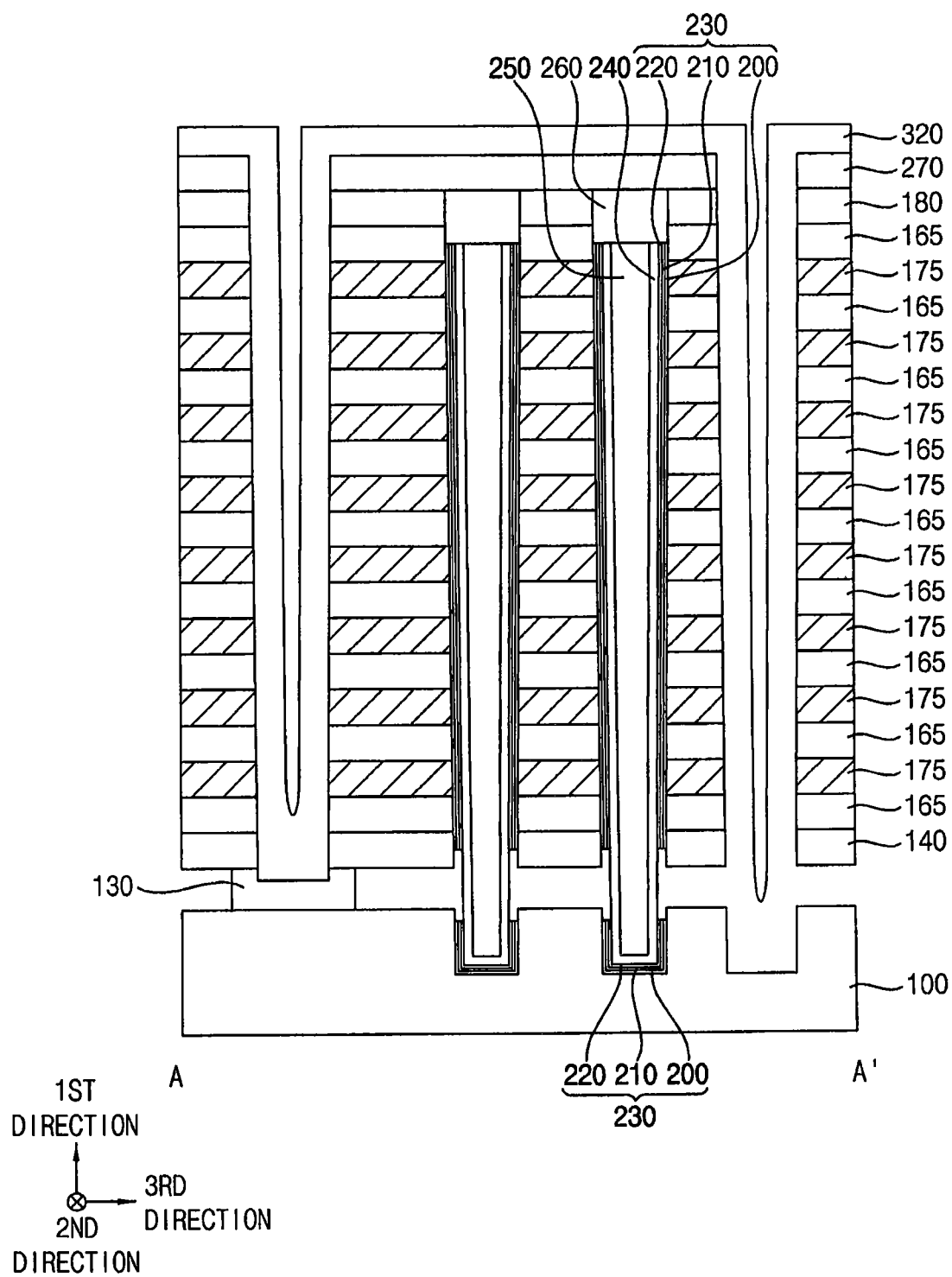

Referring to FIG. 10, a channel connecting layer 320 may be formed to fill the first gap 310. The channel connecting layer 320 may partially fill the first gap 310, according to some embodiments.

The channel connecting layer 320 may fill the first gap 310, and further be formed on a sidewall and a bottom of the second opening 290 and an upper surface of the second insulating interlayer 270.

The channel connecting layer 320 may include, e.g., polysilicon doped with n-type impurities.

Figure 11:
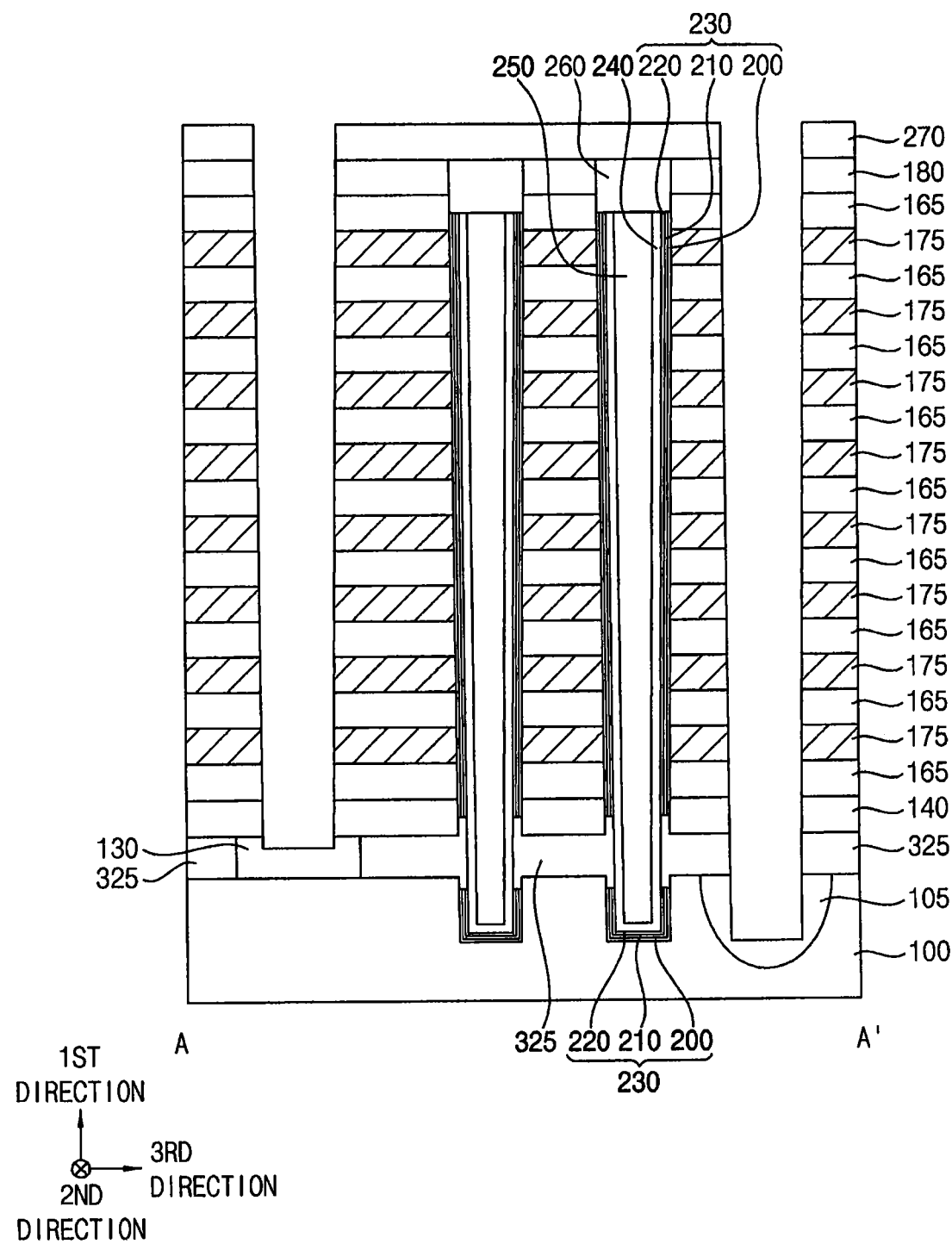

Referring to FIG. 11, the channel connecting layer 320 may be partially removed to form a channel connecting pattern 325 in the first gap 310.

In example embodiments, the channel connecting pattern 325 may be formed by removing a portion of the channel connecting layer 320 in the second opening 290 through an etch back process.

As the channel connecting pattern 325 is formed, the channels 240 forming the channel array may be connected with each other.

Impurities may be implanted into an upper portion of the substrate 100 exposed by the second opening 290 to form an impurity region 105. In example embodiments, the impurity region 105 may contact a lower surface of the channel connecting pattern 325, and thus may be electrically connected to the channel connecting pattern 325 including doped polysilicon.

Figure 12:
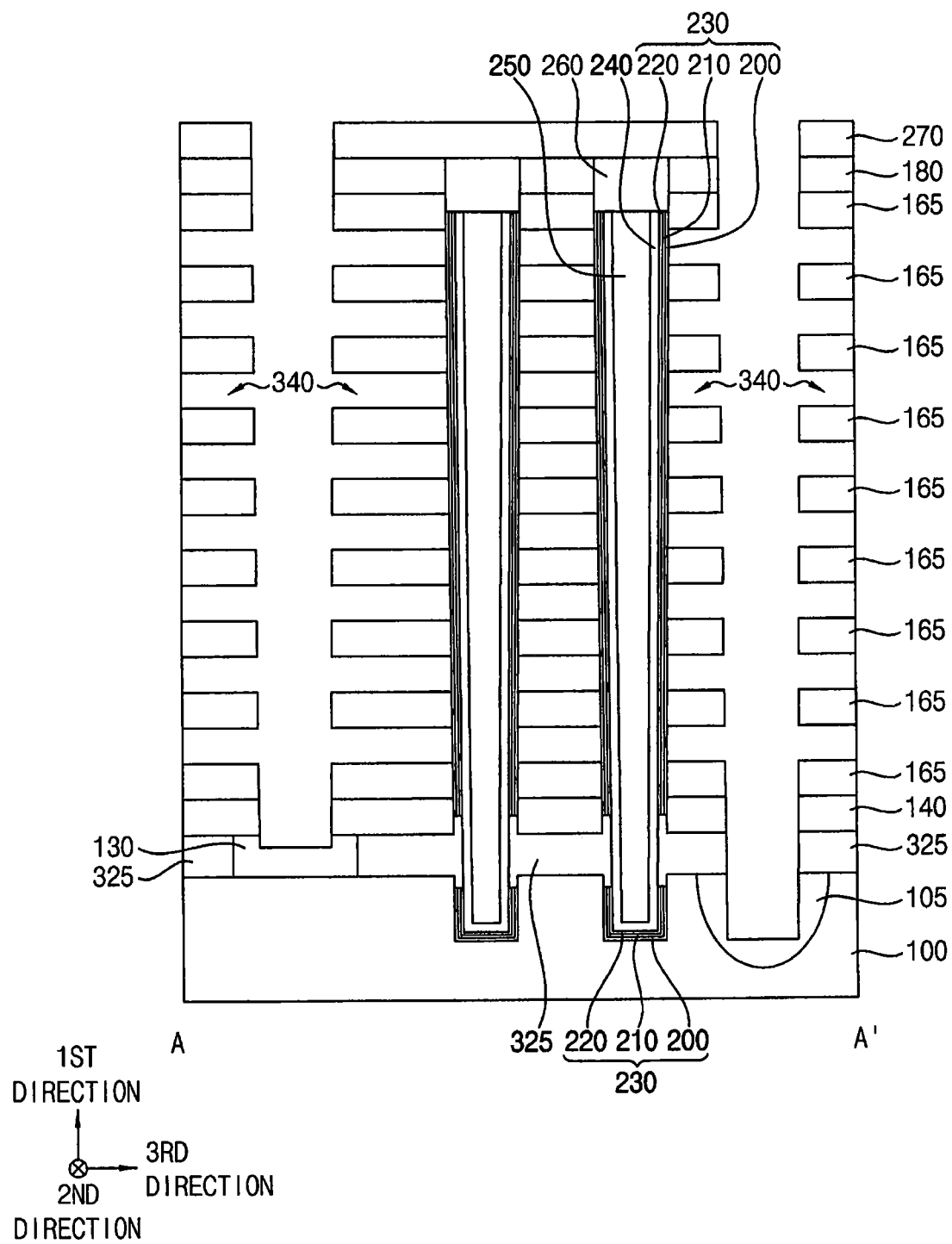

Referring to FIG. 12, the second sacrificial patterns 175 exposed by the second opening 290 may be removed to form a second gap 340 between the insulation patterns 165 at one or a plurality of levels, respectively, and an outer sidewall of the first blocking pattern 200 may be partially exposed by the second gap 340.

In example embodiments, the second sacrificial patterns 175 may be removed by a wet etching process using an etching solution including SC1 (NH4OH:H2O2:H2O mixture). The second sacrificial patterns 175 may include a material having an etching selectivity with respect to the insulation pattern 165 including, e.g., silicon oxide and the channel connecting pattern 325 and the support layer 140 including, e.g., polysilicon, which may be, e.g., germanium oxide ($GeO_2$) or silicon oxide doped with germanium (Ge-doped $SiO_2$), and thus, the insulation pattern 165, the channel connecting pattern 325 and the support layer 140 exposed by the second opening 290 may not be damaged during the wet etching process.

Particularly, germanium oxide included in the second sacrificial patterns 175 may have a high etching selectivity with respect to silicon oxide included in the insulation pattern 165, which may be greater than an etching selectivity of silicon nitride with respect to silicon oxide. Thus, the second sacrificial patterns 175 may be easily removed with less damage to the insulation pattern 165 of the mold during the wet etching process when compared to the second sacrificial patterns 175 including silicon nitride.

The second sacrificial patterns 175 may include an oxide instead of a nitride, and thus, a carbon-nitrogen (C—N) residue that may be generated when the second sacrificial patterns 175 including a nitride is etched may not be generated. Accordingly, the characteristics of neighboring layer structures, e.g., the channel 240 may not be degenerated due to the carbon-nitrogen (C—N) residue.

Figure 13:
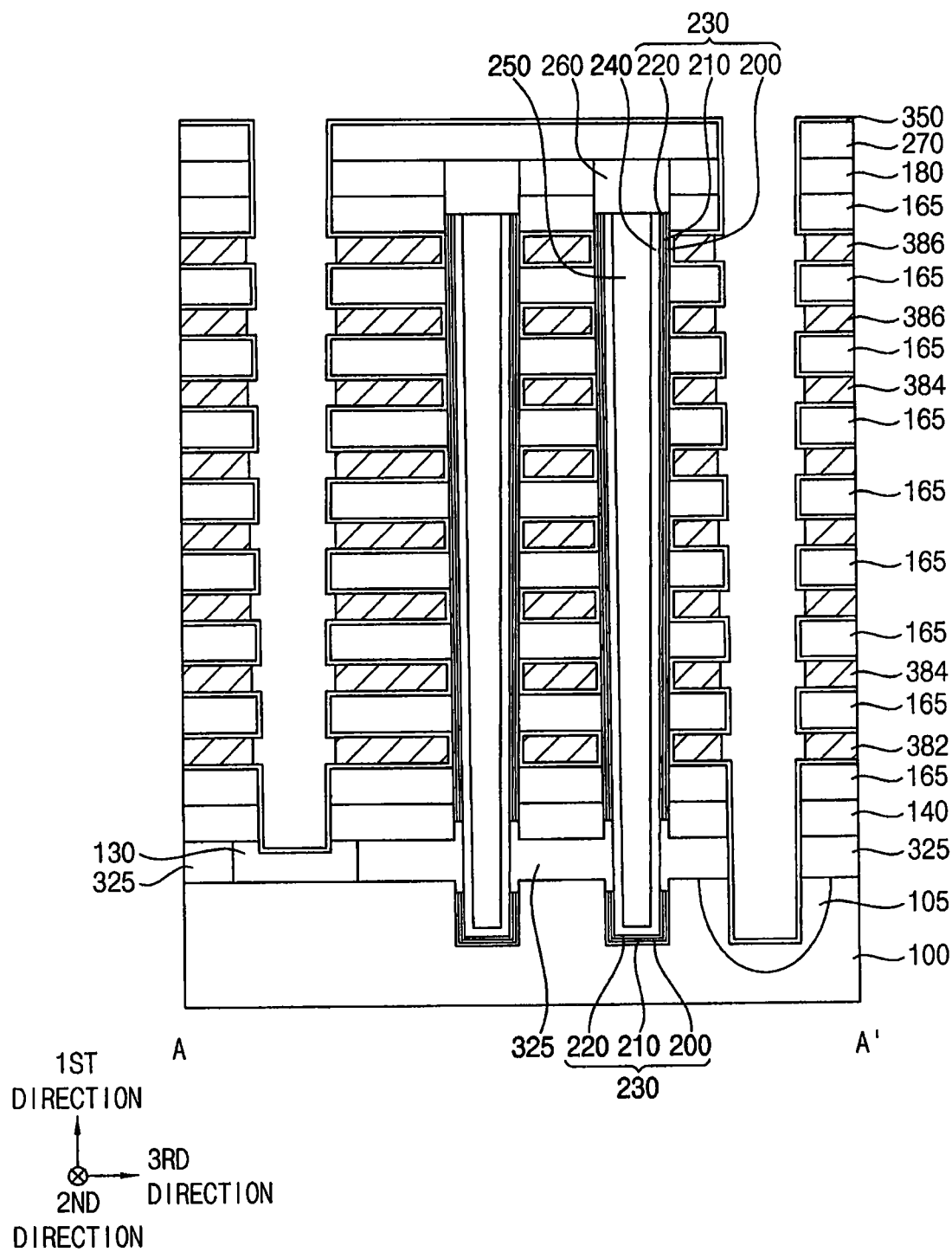

Referring to FIG. 13, a second blocking pattern 350 may be formed on the exposed outer sidewall of the first blocking pattern 200, inner walls of the second gaps 340, surfaces of the insulation patterns 165, the upper surface of the substrate 100, an upper surface of the support pattern 130, and the upper surface of the second insulating interlayer 270, and a gate electrode layer may be formed on the second blocking pattern 350.

The gate electrode layer may include a gate barrier layer and a gate conductive layer sequentially stacked. The gate electrode layer may include a low resistance metal, e.g., tungsten, titanium, tantalum, platinum, etc., and the gate barrier layer may include a metal nitride, e.g., titanium nitride, tantalum nitride, etc.

The gate electrode layer may be partially removed to form a gate electrode in each of the second gaps 340. In example embodiments, the gate electrode layer may be partially removed by a wet etching process, and thus the gate electrode may entirely or partially fill each of the second gaps 340.

The gate electrode may extend in the second direction, and a plurality of gate electrodes may be formed in the third direction. That is, the gate electrodes each of which may extend in the second direction may be spaced apart from each other by the second opening 290.

In example embodiments, the gate electrode may be formed at a plurality of levels spaced apart from each other in the first direction, and the gate electrodes at the plurality of levels may form a gate electrode structure. The gate electrode structure may include at least one first gate electrode 382, a plurality of second gate electrodes 384, and at least one third gate electrode 386. The number of levels at which the first to third gate electrodes 382, 384 and 386 are formed may be changed according to the number of levels of the second sacrificial layers 170.

Figure 14:
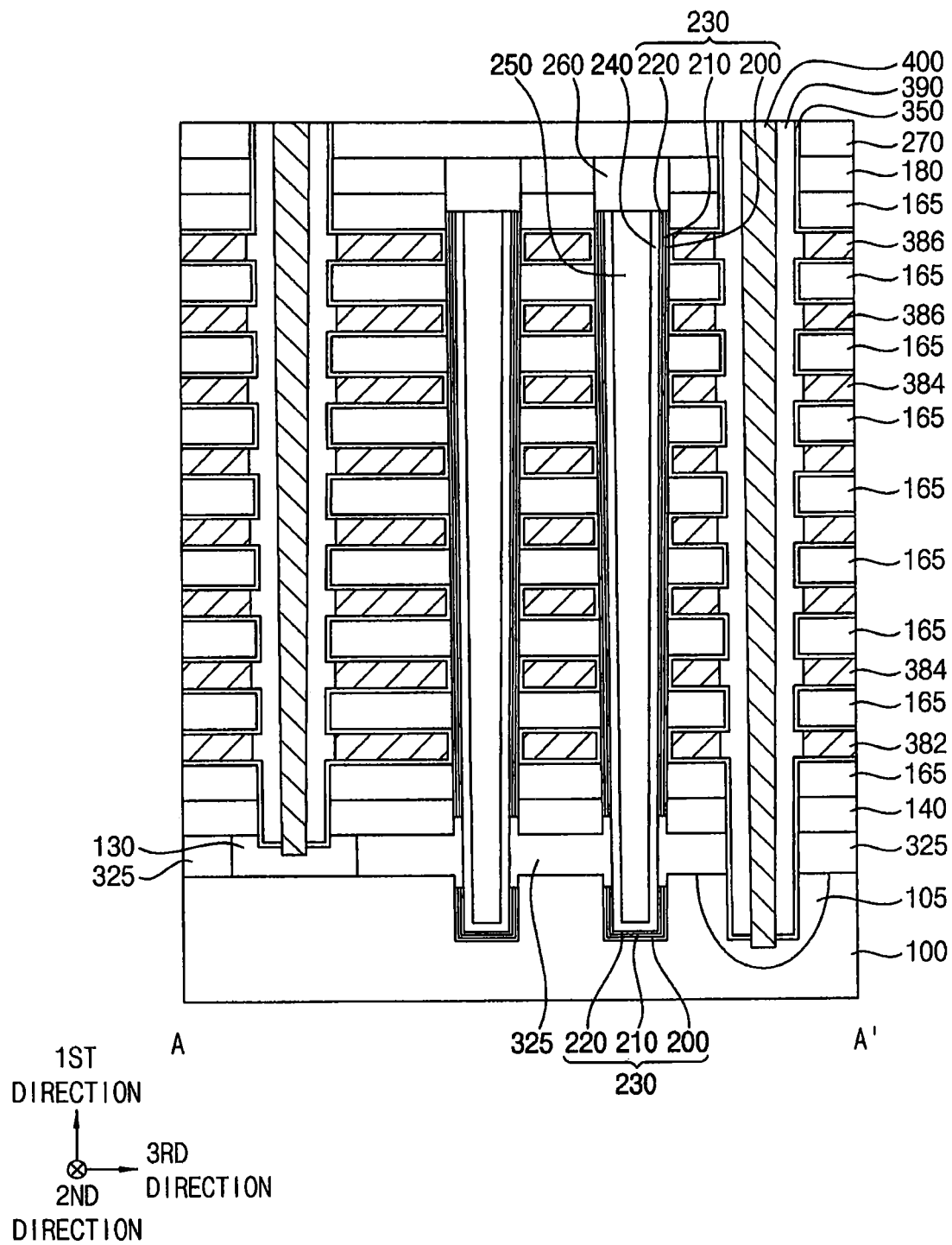

Referring to FIG. 14, a spacer layer may be formed on the second blocking pattern 350 and anisotropically etched to form a spacer 390 on the sidewall of the second opening 290, and thus an upper surface of the second blocking pattern 350 may be partially exposed.

A portion of the second blocking pattern 350 not covered by the spacer 390 may be etched, and a portion of the second blocking pattern 350 on the upper surface of the second insulating interlayer 270 may be also etched. Additionally, upper portions of the substrate 100 and the support pattern 130 may be removed.

A conductive layer may be formed on the upper surface of the substrate 100, the upper surface of the support pattern 130, the spacer 390 and the second insulating interlayer 270 to fill a remaining portion of the second opening 290, and may be planarized until the upper surface of the second insulating interlayer 270 may be exposed to form a common source line (CSL) 400. The CSL 400 may include a metal, e.g., tungsten.

In example embodiments, the CSL 400 may extend in the first direction, and also in the second direction. A lower surface of the CSL 400 may be covered by the substrate 100, that is, the impurity region 105 and/or the support pattern 130. Thus, current generated by voltage applied from the CSL 400 may flow through the impurity region 105 and the channel connecting pattern 325 to the channel 240. The CSL 400 may extend through a bottom portion of the spacer 390.

Figure 15:
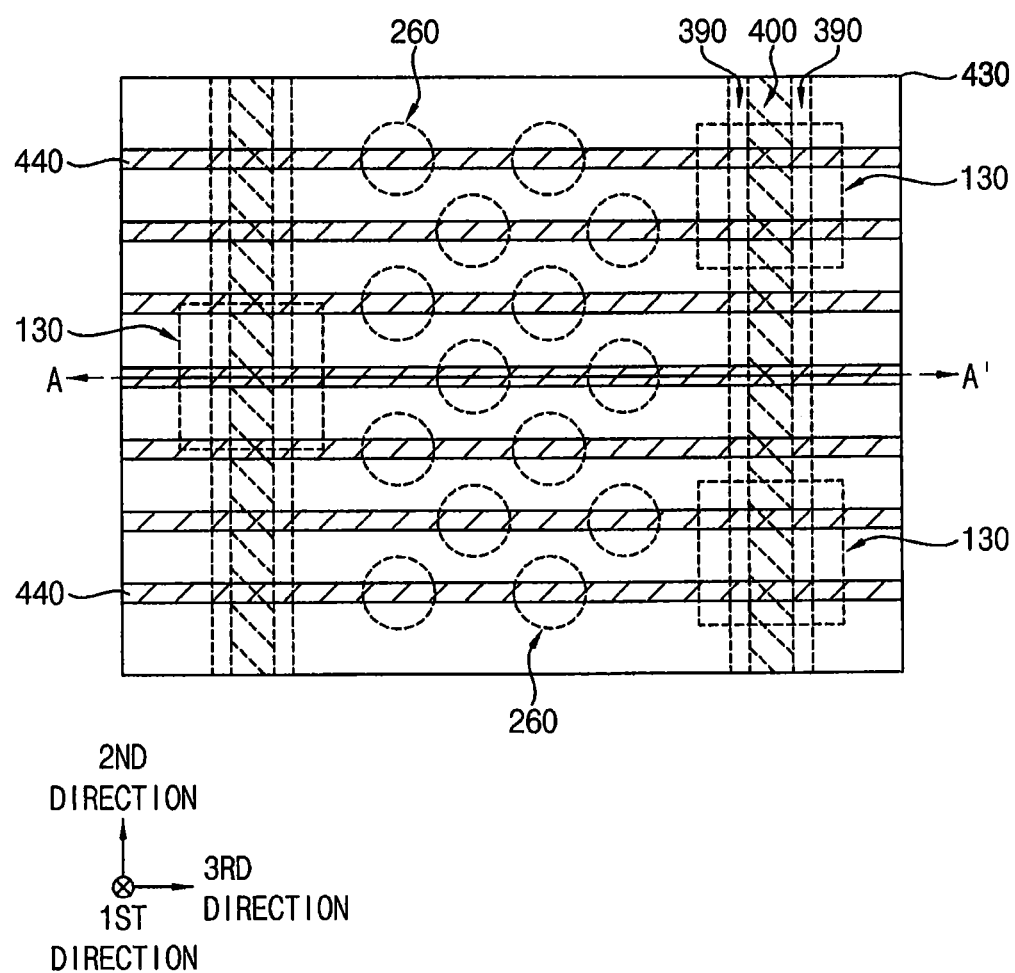
Figure 16:
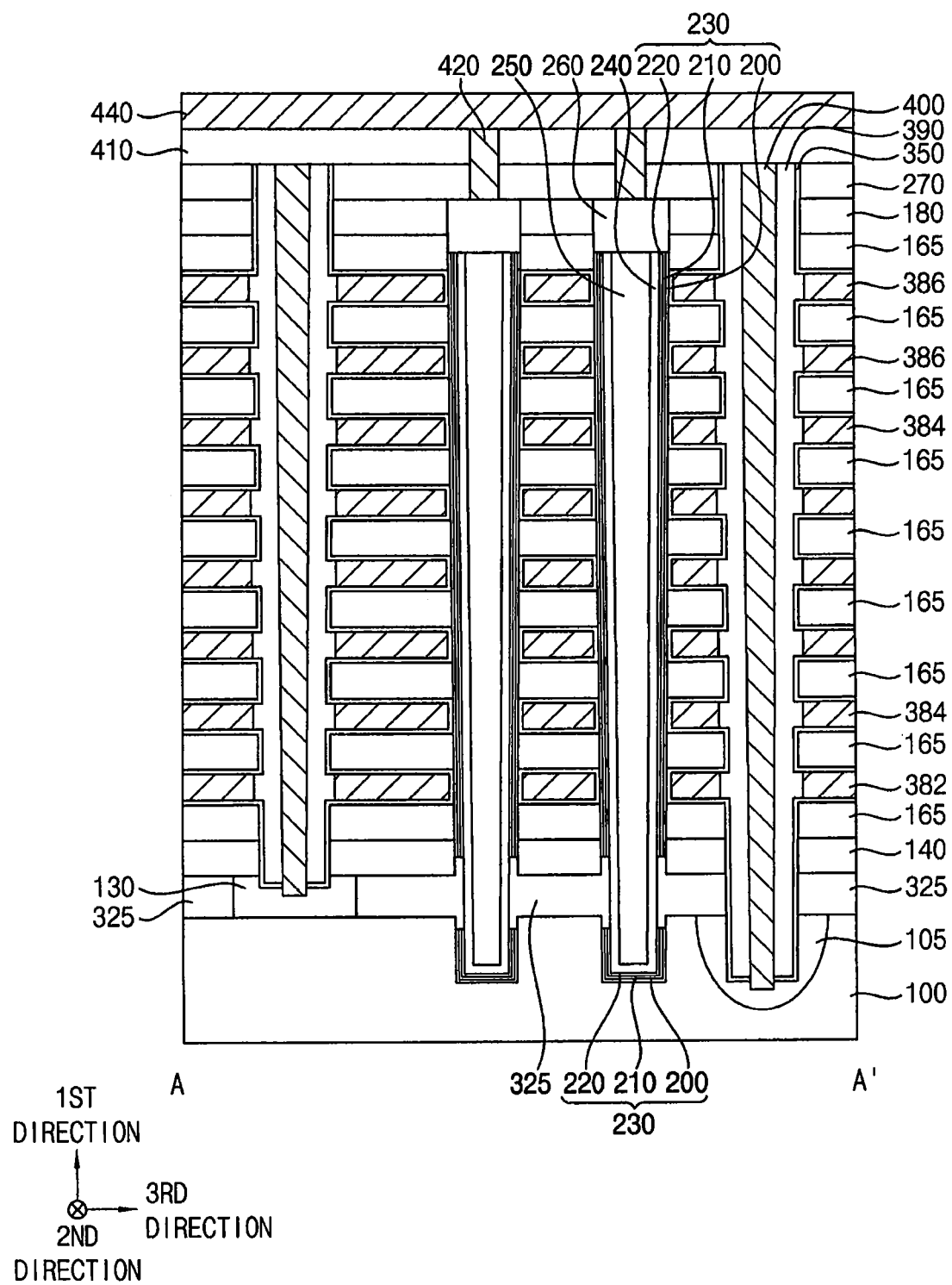

Referring to FIGS. 15 and 16, after forming a third insulating interlayer 410 on the second insulating interlayer 270, the CSL 400, the spacer 390, and the second blocking pattern 350, a contact plug 420 may be formed through the second and third insulating interlayers 270 and 410 to contact an upper surface of the capping pattern 260. A fourth insulating interlayer 430 may be formed on the third insulating interlayer 410 and the contact plug 420, and a bit line 440 may be formed through the fourth insulating interlayer 430 to contact an upper surface of the contact plug 420.

As discussed above, the vertical memory device may be fabricated by forming the first sacrificial layer 120 including a first insulating material on the substrate 100, forming the mold having the insulation layer 160 and the second sacrificial layer 170 including second and third insulating materials, respectively, different from the first insulating material alternately and repeatedly stacked, forming the channel 240 through the mold and the first sacrificial layer 120, forming the second opening 290 through the mold and the first sacrificial layer 120 to expose the upper surface of the substrate 100, removing the first sacrificial layer 120 through the second opening 290 to form the first gap 310, forming the channel connecting pattern 325 to fill the first gap 310, and replacing the second sacrificial layer 170 with the gate electrode.

In example embodiments, the first sacrificial layer 120 may include a material having an etching selectivity with respect to the insulation pattern 165 and the second sacrificial pattern 175 of the mold. For example, the first sacrificial layer 120 may include silicon oxide, which may have a high etching selectivity with respect to silicon oxide and germanium oxide included in the insulation pattern 165 and the second sacrificial pattern 175, respectively.

In example embodiments, the first sacrificial layer 120 may be removed by a wet etching process using an etching solution including phosphoric acid or sulfuric acid, which may have an etching selectivity with respect to the first sacrificial layer 120 greater than with respect to the insulation pattern 165 and the second sacrificial pattern 175. Thus, during the wet etching process, the insulation pattern 165 and the second sacrificial pattern 175 exposed by the second opening 290 may not be damaged. Accordingly, the first sacrificial layer 120 may be removed with no etch stop pattern on the sidewall of the second opening 290.

In example embodiments, the second sacrificial pattern 175 may include a material having an etching selectivity with respect to the insulation pattern 165 and the channel connecting pattern 325 substituted for the first sacrificial layer 120. For example, the second sacrificial pattern 175 may include germanium oxide, which may have a high etching selectivity with respect to silicon oxide and polysilicon of the insulation pattern 165 and the channel connecting pattern 325, respectively.

In example embodiments, the second sacrificial pattern 175 may be removed by a wet etching process using a solution including SC1. During the wet etching process, the solution may have an etching selectivity with respect to the second sacrificial pattern 175 greater than that with respect to the insulation pattern 165 and the channel connecting pattern 325, and thus the insulation pattern 165 and the channel connecting pattern 325 may not be damaged during the wet etching process.

Particularly, germanium oxide included in the second sacrificial pattern 175 may have a high etching selectivity with respect to silicon oxide included in the insulation pattern 165, which may be greater than an etching selectivity of the second sacrificial pattern 175 including silicon nitride with respect to silicon oxide. Accordingly, the damage to the insulation pattern 165 of the mold may be very small during the wet etching process.

Additionally, the second sacrificial pattern 175 may include an oxide instead of a nitride, and thus a carbon-nitrogen (C—N) residue that may be generated if the second sacrificial pattern 175 includes the nitride may not be generated. Accordingly, the characteristics of neighboring layer structures, e.g., the channel 240 may not be degenerated due to the carbon-nitrogen (C—N) residue.

FIGS. 17 to 21 are cross-sectional views illustrating a method of manufacturing a vertical memory device in accordance with example embodiments. This method may include processes substantially the same as or similar to those illustrated with reference to FIGS. 1 to 16, and thus detailed descriptions thereon are omitted herein.

Figure 17:
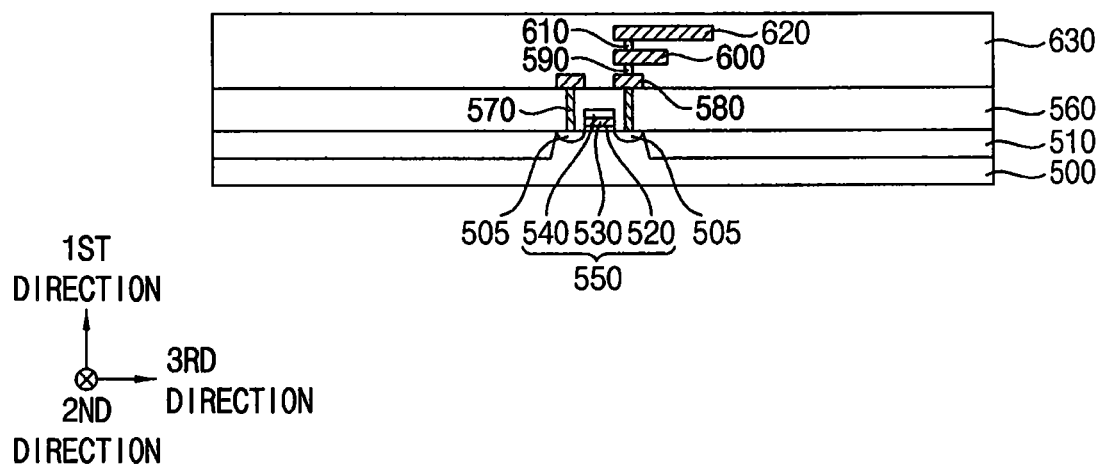
FIGS. 17 to 21 are cross-sectional views illustrating a method of manufacturing a vertical memory device in accordance with example embodiments.

Referring to FIG. 17, circuit patterns may be formed on a substrate 500, and first and second lower insulating interlayers 560 and 630 may be formed on the substrate 500 to cover the circuit patterns.

The vertical memory device may have a cell over peri (COP) structure. That is, a circuit pattern region and a cell array region may be vertically stacked on the substrate 500. The substrate 500 may include a field region having an isolation pattern 510 thereon and an active region.

The circuit patterns may include transistors, lower contact plugs, lower wirings, lower vias, etc. In example embodiments, a transistor including a lower gate structure 550 and a lower impurity region 505 at an upper portion of the active region of the substrate 500 adjacent to the lower gate structure 550 may be formed. The lower gate structure 550 may include a lower gate insulation pattern 520, a lower gate electrode 530, and a lower gate mask 540 sequentially stacked on the substrate 500.

The first lower insulating interlayer 560 may be formed on the substrate 500 to cover the transistor, and a lower contact plug 570 may extend through the first lower insulating interlayer 560 to contact the lower impurity region 505.

A first lower wiring 580 may be formed on the first lower insulating interlayer 560 to contact an upper surface of the lower contact plug 570. A first lower via 590, a second lower wiring 600, a second lower via 610 and a third lower wiring 620 may be sequentially stacked on the first lower wiring 580.

A second lower insulating interlayer 630 may be formed on the first lower insulating interlayer 560 to cover the first to third lower wirings 580, 600 and 620 and the first and second lower vias 590 and 610. The second lower insulating interlayer 630 may be merged with the first lower insulating interlayer 560.

Figure 18:
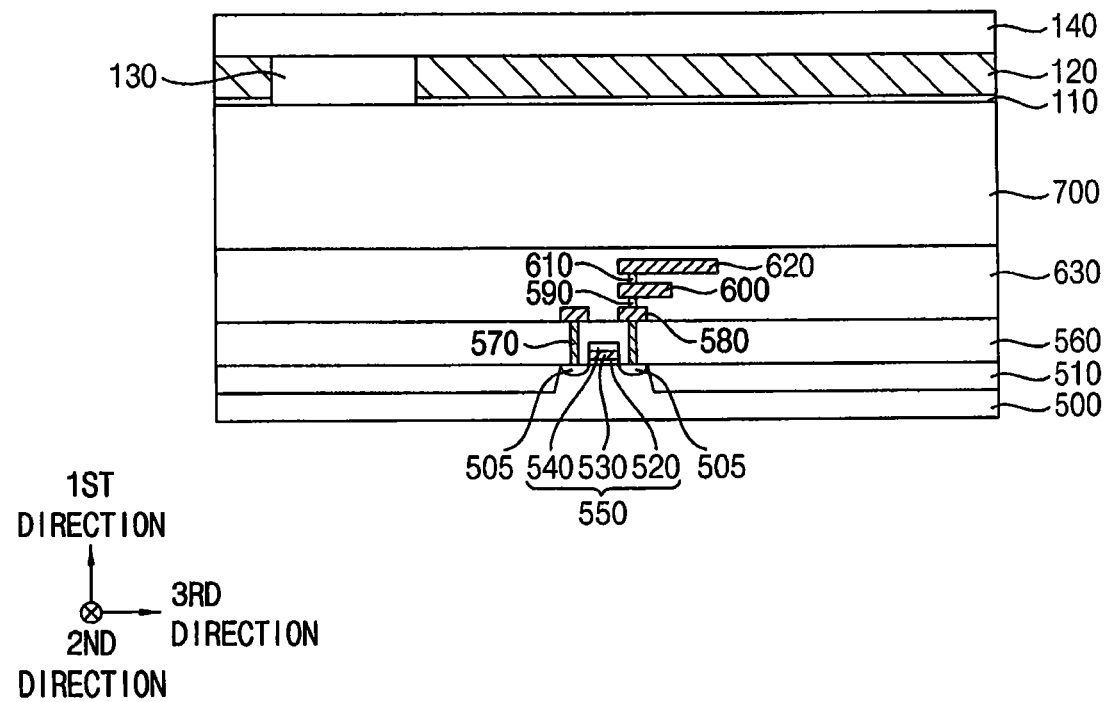

Referring to FIG. 18, a base pattern 700 may be formed on the second lower insulating interlayer 630.

The base pattern 700 may be formed by forming a base layer on the second insulating interlayer 630 and patterning the base layer so as to remain on a give region, for example, on the cell array region of the substrate 500. The base pattern 700 may include a semiconductor material, e.g., polysilicon.

Processes substantially the same as or similar to those illustrated with reference to FIGS. 1 and 2 may be performed.

Thus, the pad layer 110 and the first sacrificial layer 120 may be sequentially stacked on the base pattern 700, the support pattern 130 extending through the pad layer 110 and the first sacrificial layer 120 may be formed on the base pattern 700, and the support layer 140 may be formed on the first sacrificial layer 120 and the support pattern 130.

Figure 19:
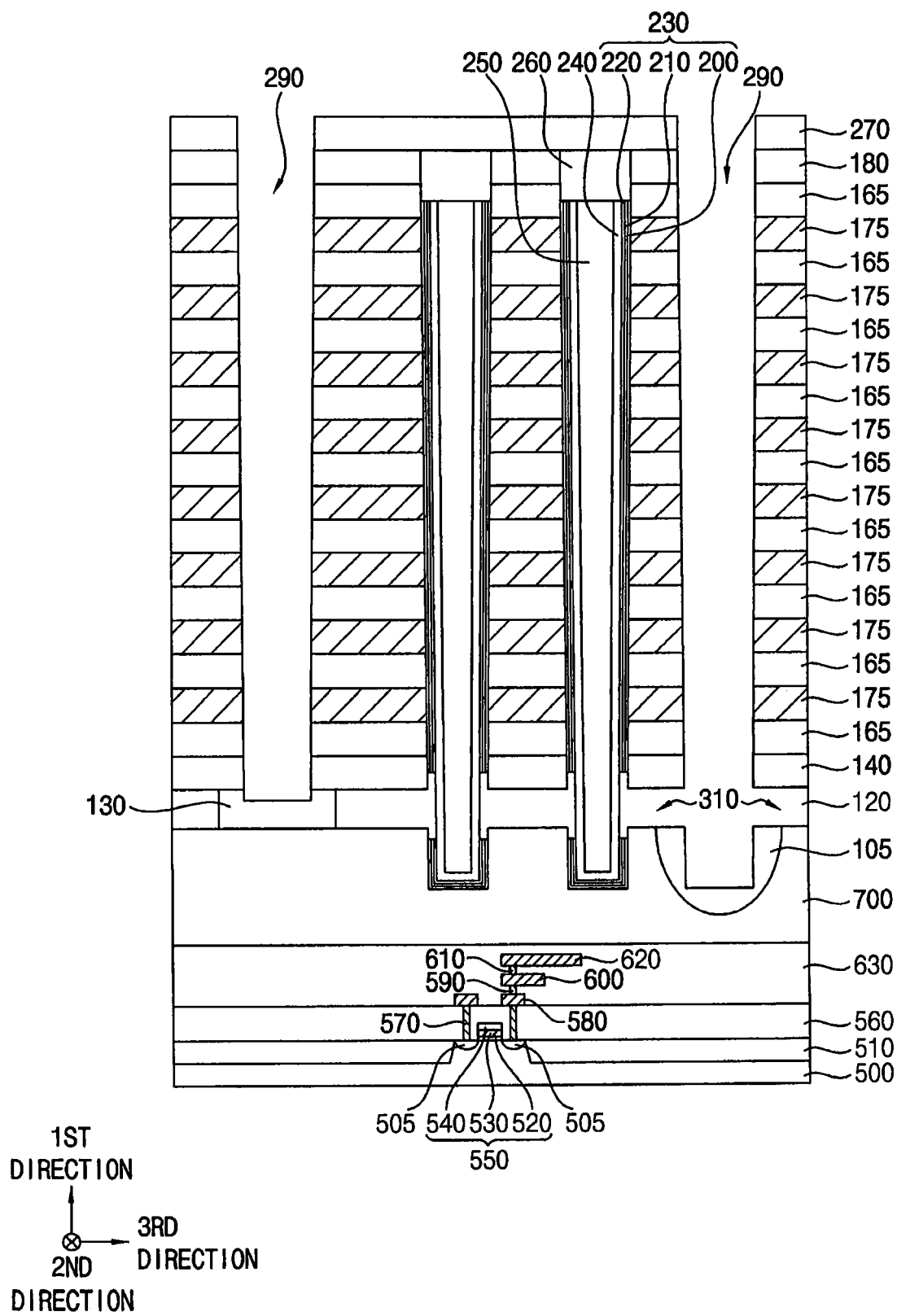

Referring to FIG. 19, processes substantially the same as or similar to those illustrated with reference to FIGS. 3 to 9 may be performed.

Thus, as discussed with respect to FIGS. 3 to 9 and further discussed herein, the mold including the insulation layer 160 and the second sacrificial layer 170 sequentially stacked may be formed on the support layer 140, the channel 240 extending through the mold and the charge storage structure 230 covering a lower surface and a sidewall of the channel 240 may be formed, the second opening 290 extending through the mold, the support layer 140 and the first sacrificial layer 120 to expose an upper surface of the base pattern 700 may be formed, and the first sacrificial layer 120 and a portion of the charge storage structure 230 may be removed through the second opening 290. Additionally, the impurity region 105 may be formed at the upper portion of the base pattern 700 exposed by the second opening 290.

Figure 20:
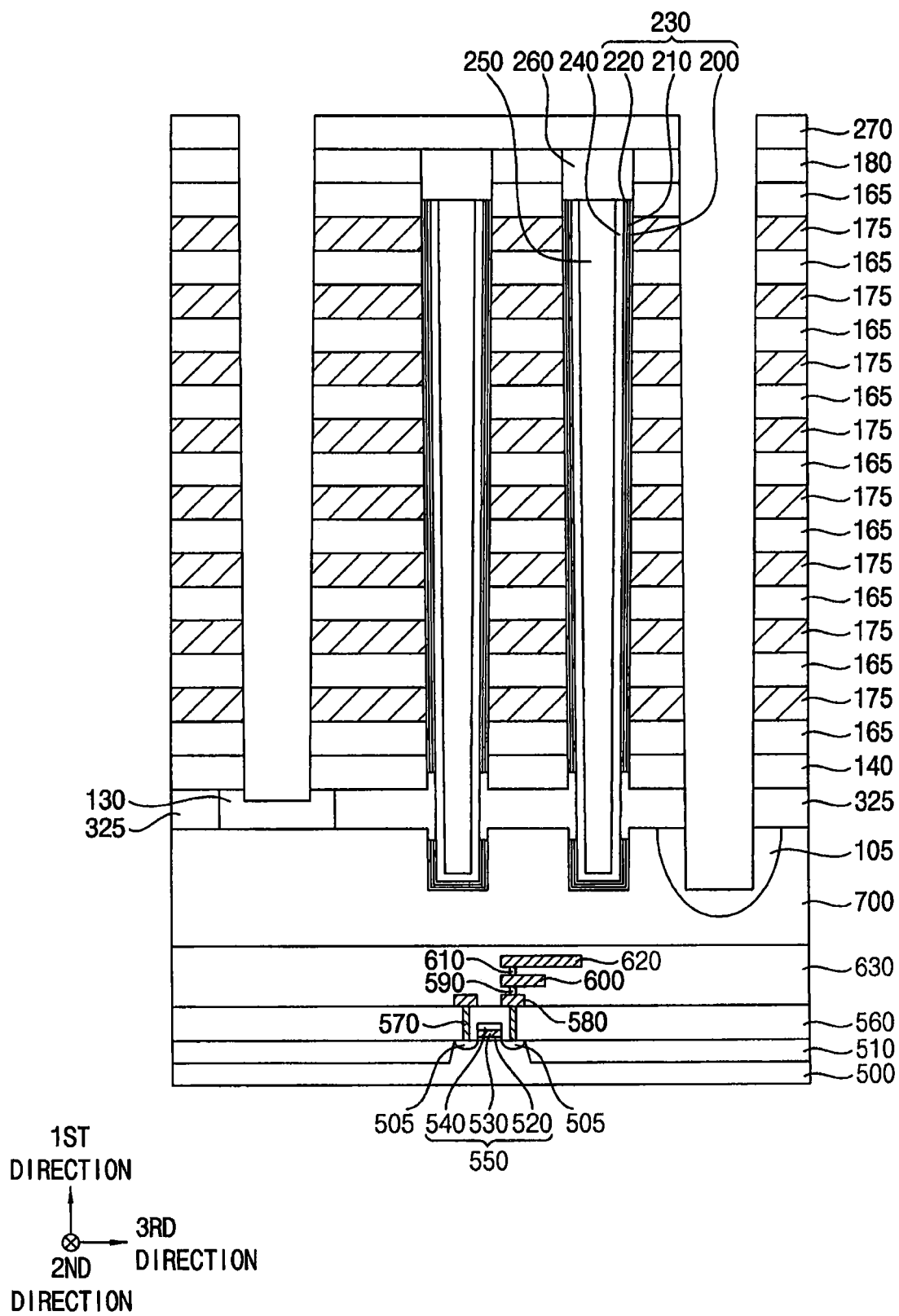

Referring to FIG. 20, processes substantially the same as or similar to those illustrated with reference to FIGS. 10 and 11 may be performed, and thus the channel connecting pattern 325 filling the first gap 310 may be formed so that the channels 240 may be connected with each other.

Figure 21:
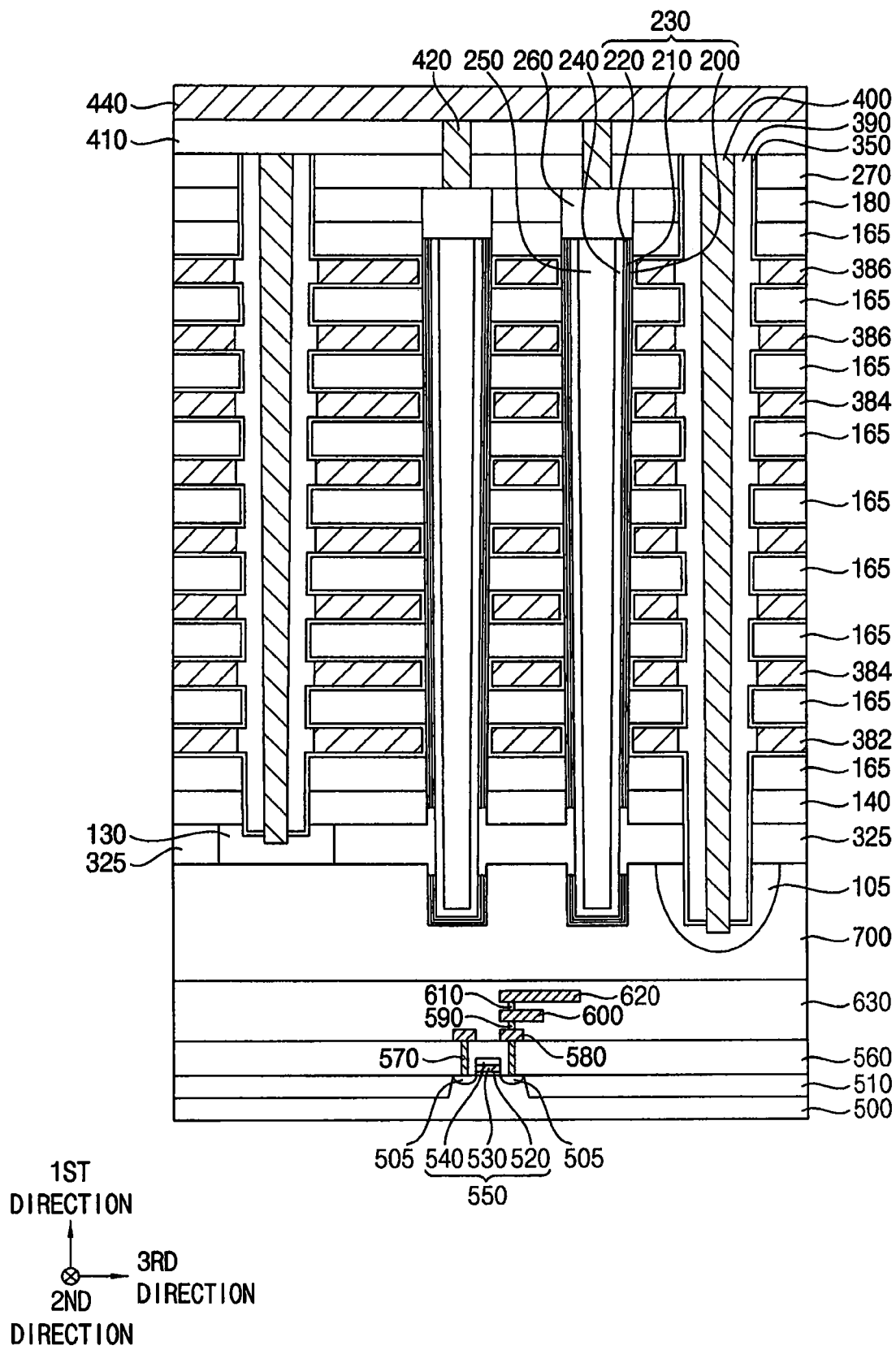

Referring to FIG. 21, processes substantially the same as or similar to those illustrated with reference to FIGS. 12 to 16 may be performed to complete the fabrication of the vertical memory device.

The vertical memory device may have a COP structure, and thus the base pattern 700 including, e.g., polysilicon may be formed over the circuit patterns, the mold may be formed on the base pattern 700, and the channels 240 may be formed through the mold.

The base pattern 700 may not include a single crystalline semiconductor material, and thus semiconductor patterns having uniform characteristics may not be formed by a SEG process using the base pattern 700 as a seed, and the channels 240 may not be uniformly connected to the base pattern 700 by the semiconductor patterns. However, in accordance with example embodiments, the channels 240 on the base pattern 700 may be connected with each other by the channel connecting pattern 325 that may be formed by removing the first sacrificial layer 120, and thus no semiconductor patterns may be formed by a SEG process.

While example embodiments have been particularly shown and described, it will be understood by one of ordinary skill in the art that variations in form and detail may be made therein without departing from the spirit and scope of the claims.

What is claimed is:

1. A method of manufacturing a vertical memory device, the method comprising:
   forming a first sacrificial layer on a substrate, wherein the first sacrificial layer comprises a nitride;
   forming a mold comprising an insulation layer and a second sacrificial layer alternately and repeatedly stacked on the first sacrificial layer, wherein the insulation layer and the second sacrificial layer comprise a first oxide and a second oxide, respectively;
   forming a channel through the mold and the first sacrificial layer;
   forming an opening through the mold and the first sacrificial layer to expose an upper surface of the substrate;

removing the first sacrificial layer through the opening to form a first gap;
forming a channel connecting pattern in the first gap; and
replacing the second sacrificial layer with a gate electrode.

2. The method of claim 1,
wherein the insulation layer comprises silicon oxide, and
wherein the second sacrificial layer comprises germanium oxide or silicon oxide doped with germanium.

3. The method of claim 1, wherein the first sacrificial layer comprises silicon nitride.

4. The method of claim 1, wherein forming the channel connecting pattern comprises:
forming a channel connecting layer in the first gap and on a sidewall of the opening; and
removing a portion of the channel connecting layer in the opening.

5. The method of claim 1, wherein the channel connecting pattern comprises polysilicon doped with impurities.

6. The method of claim 1, further comprising:
after forming the channel, forming a charge storage structure on an outer sidewall of the channel,
after removing the first sacrificial layer, removing a portion of the charge storage structure exposed by the first gap.

7. The method of claim 6, wherein the charge storage structure comprises a tunnel insulation pattern, a charge storage pattern and a blocking pattern sequentially stacked on the outer sidewall of the channel.

8. The method of claim 7,
wherein the tunnel insulation pattern and the blocking pattern comprise silicon oxide, and
wherein the charge storage structure comprises silicon nitride.

9. The method of claim 1, further comprising:
forming a support pattern having an upper surface substantially coplanar with that of an upper surface of the first sacrificial layer,
wherein the support pattern comprises a material different from the first sacrificial layer.

10. The method of claim 9, further comprising:
prior to forming the mold, forming a support layer on the first sacrificial layer and the support pattern.

11. The method of claim 10, wherein the support layer comprises undoped or doped polysilicon.

12. The method of claim 1, wherein replacing the second sacrificial layer with the gate electrode comprises:
removing the second sacrificial layer through the opening to form a second gap; and
forming the gate electrode in the second gap.

13. A method of manufacturing a vertical memory device, the method comprising:
forming a first sacrificial layer on a substrate, wherein the first sacrificial layer comprises a nitride;
forming a mold comprising an insulation layer and a second sacrificial layer alternately and repeatedly stacked on the first sacrificial layer, wherein the insulation layer comprises silicon oxide, and the second sacrificial layer comprises germanium oxide or silicon oxide doped with germanium;
forming a channel through the mold and the first sacrificial layer;
forming an opening through the mold and the first sacrificial layer to expose an upper surface of the substrate;
removing the first sacrificial layer through the opening to form a gap;
forming a channel connecting pattern in the gap; and
replacing the second sacrificial layer with a gate electrode.

14. The method of claim 13, further comprising:
prior to forming the mold, forming a support layer comprising doped or undoped polysilicon.

* * * * *